United States Patent [19]
Nayebi et al.

[11] Patent Number: 6,100,726
[45] Date of Patent: Aug. 8, 2000

[54] HIGH INPUT IMPEDANCE BUFFER CIRCUIT HAVING A HIGH-SIDE CURRENT SOURCE CIRCUIT WITH RCB CANCELLATION

[75] Inventors: Mehrdad Nayebi, Palo Alto; Stephen D. Edwards, San Jose; Phil Shapiro, Palo Alto, all of Calif.

[73] Assignees: Sony Corporation of Japan, Tokyo, Japan; Sony Electronics, Inc., Park Ridge, N.J.

[21] Appl. No.: 09/219,200

[22] Filed: Dec. 21, 1998

Related U.S. Application Data

[63] Continuation-in-part of application No. 09/183,452, Oct. 30, 1998, and a continuation-in-part of application No. 09/183,198, Oct. 30, 1998, and a continuation-in-part of application No. 09/183,321, Oct. 30, 1998.

[51] Int. Cl.[7] .............................. H03B 1/00; H03K 3/00

[52] U.S. Cl. ........................... 327/108; 327/333; 327/491

[58] Field of Search .............................. 327/77, 333, 379, 327/478, 491, 108; 326/26, 89

[56] References Cited

U.S. PATENT DOCUMENTS

| | | | |
|---|---|---|---|
| 5,278,464 | 1/1994 | Pelley, III et al. | 326/89 |
| 5,414,382 | 5/1995 | Larson et al. | 327/561 |

*Primary Examiner*—Timothy P. Callahan
*Assistant Examiner*—Anh-Quan Tra
*Attorney, Agent, or Firm*—Wagner, Murabito & Hao LLP

[57] ABSTRACT

A buffer circuit having a high input impedance. The buffer circuit comprises an input lead, a first stage having a first emitter follower transistor and a first level shifter transistor, a second stage having a second emitter follower transistor and a second level shifter transistor, and an output lead coupled to said second stage. The first emitter follower transistor is coupled to the input lead and coupled to the first level shifter transistor. The first and second stage of the buffer circuit acts as a voltage follower. The second emitter follower transistor is coupled to the second level shifter transistor, while the second emitter follower transistor is coupled to the first emitter follower transistor. The buffer circuit has a high input impedance and very low leakage current. Hence, it is ideal for sampling filter components of a phase lock loop circuit within a high frequency clock generation circuit thereby reducing clock jitter.

28 Claims, 6 Drawing Sheets

HIGH INPUT IMPEDANCE BUFFER CIRCUIT HAVING A HIGH-SIDE CURRENT SOURCE CIRCUIT WITH RCB CANCELLATION

This is a continuation in part of application Ser. No. 09/183,452, filed Oct. 30, 1998, application Ser. No. 09/183,198, filed Oct. 30, 1998, and Ser. No. 09/183,321, filed Oct. 30, 1998.

BACKGROUND OF THE INVENTION

1. Field of the Invention

The present claimed invention relates to the field of signal buffer circuits. More particularly, the present invention relates to a method and apparatus for increasing input impedance of a buffer circuit.

2. Related Art

High speed digital systems, such as engineering workstations and personal computers, require clock sources that have low jitter and low phase lock loop (PLL) bandwidths. Phase jitter in a system clock reduces the effective clock speed of the workstation or personal computer. More processing performance is gained, for a given clock rate, if the clock signal has less jitter. Therefore, it is advantageous to reduce clock jitter within a clock generation circuit ("clock generator"). Clock generators typically contain PLL circuits.

The PLL circuitry in the clock generator typically contains a voltage controlled oscillator (VCO) that receives a voltage level maintained by filter components. Normally, charging currents and voltage controlled oscillator gains are so high that externally situated filter components are required to achieve the low jitter and bandwidth requirements for clock generator circuits. However, external, e.g., "off-chip," filter components (e.g., capacitors, etc.) increase the overall cost of the digital system in part by making manufacturing more complex, and also increase the physical size of the digital system. Furthermore, off-chip filter components also decrease system reliability by increasing the phase jitter by allowing external noise to be injected into the clock circuit through the PLL filter. Clock jitter is reduced if external elements of the PLL loop filter can be eliminated. To integrate filter components "on-chip," it is necessary to use smaller sized filter components. However, this leads to tighter filter leakage requirements because smaller sized capacitors are more sensitive to changes in current when compared to larger sized capacitors.

It is desired to reduce the effects of leakage current within a PLL circuit because, as discussed above, on-chip filter components are very sensitive to small leakage currents. PLL filters are normally driven by current source circuits and require outputs having a very high impedance. A problem exists in eliminating off-chip filters and placing them on-chip. Namely, reducing the size of the filters (thereby allowing them to be placed on-chip) unfortunately makes these components more sensitive to leakage current which impedes the ideal operation of certain PLL circuits. As a result, it is desired to use buffer circuits that have reduced leakage current to drive differential filters for higher PLL accuracy. At the same time, this circuitry needs to operate from increasingly lower power supply voltages, e.g., to accommodate hand-held and other portable battery operated applications.

Likewise, it is advantageous to sample the filter elements within PLL circuits using high input impedance buffer circuits. The high impedance buffer circuits additionally reduces current leakage across the filter elements.

In operation, a PLL circuit injects current into filter components to establish a voltage at the input of a voltage controlled oscillator circuit in order to alter the frequency of oscillation of the PLL. This current is then ideally held constant over a long period of time (e.g., a "hold time") to maintain the oscillation frequency. During the hold time, the filter elements are electrically sampled by buffer circuits. Leakage across the filter component during the hold time, which exists between PLL correction pulses, will charge the filter component thereby changing its voltage. This changing voltage causes time jitter in the clock frequency because it changes the input voltage to the internal voltage controlled oscillator circuit. Therefore, it is necessary to reduce leakage current associated with the PLL filter component in order to provide an accurate oscillation frequency.

Figure 1:
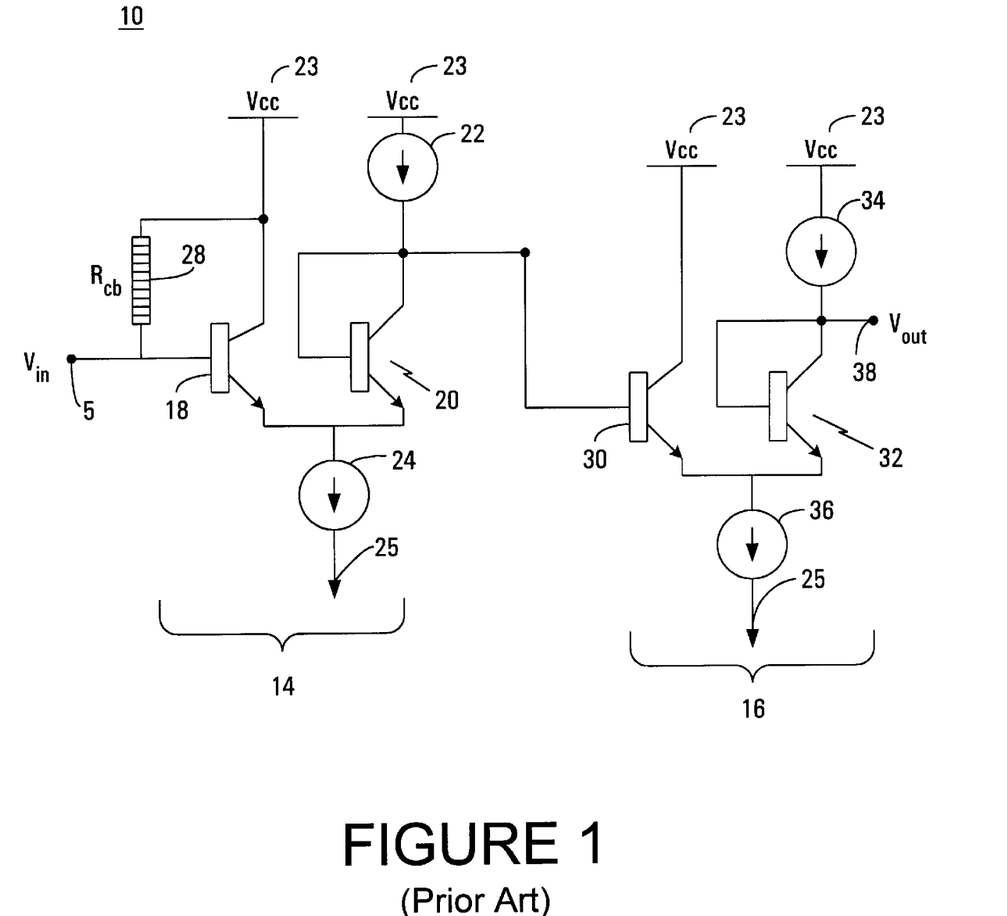
FIG. 1 illustrates a buffer circuit design of the prior art.

One method for reducing leakage current associated with the PLL filter component is to increase the input impedance of the buffer circuits which sample the voltage across the filter elements, e.g., capacitors and/or resistors in electrical combination. FIG. 1 illustrates one such prior art buffer circuit 10. The buffer circuit has a first stage 14 and a second stage 16.

Both stages act as high impedance voltage followers. The voltage input, Vin, into the first stage is applied to node 5 and the voltage output, Vout, from the first stage is shown at node 26. In the first stage, transistor 18 is an emitter follower transistor while transistor 20 provides level shifting. Filter elements would be coupled to node 5. Current source transistors 22 and 24 provide biasing for transistors 18 and 20. The output node, Vout, is taken at node 26 which is coupled to transistor 20. Transistors 18 and current source 22 are coupled to a power supply, Vcc, 23. Current source transistor 24 is coupled to ground 25. The input impedance of the buffer circuit 10 is a function of the beta value of transistor 18 multiplied by the parallel combination of the parallel output impedance of current source transistors 22 and 24. Unfortunately, however, it has been determined that this input impedance buffer scheme is still not enough to meet the stringent requirements necessary to implement an on-chip filter.

Accordingly, what is needed is a buffer circuit for buffering an input voltage level that has a higher input impedance than that realized by prior art buffer circuits. What is also needed is a buffer circuit having a higher input impedance than realized by the prior art buffer circuits described above that can also effectively operate within a low power supply voltage environment. Such a buffer circuit can advantageously be used within a clock generation circuit to sample the charge on an integrated circuit capacitor of a PLL circuit. The claimed present invention provides these advantageous capabilities.

SUMMARY OF THE INVENTION

A high input impedance buffer circuit is described herein that reduces the effects of leakage current while increasing input impedance. The buffer circuit is comprised of an input lead, a first stage having a first emitter follower transistor and a first level shifter transistor, a second stage having a second emitter follower transistor and a second level shifter transistor, and an output lead coupled to said second stage. The first emitter follower transistor is coupled to the input lead and to the first level shifter transistor. The first and second stage of the buffer circuit both act as high impedance voltage followers. The second emitter follower transistor is coupled to the second level shifter transistor and to the first emitter follower transistor. The buffer circuit has a high input impedance and very low leakage current. Hence, it is ideal for sampling filter components of a phase lock loop circuit within a high frequency clock generation circuit, thereby reducing clock jitter. The buffer circuit of the present invention is characterized in that it provides a high input and and very low leakage current making it ideal for sampling the filter components of a phase lock loop circuit within a high frequency clock generation circuit with reduced clock jitter.

In another embodiment, the claimed present invention recites a method for increasing the input impedance of a buffer circuit. The buffer circuit has an emitter follower coupled to a level shifter transistor in a first stage and an emitter follower coupled to a level shifter transistor in a second stage. In one step, a first emitter follower transistor impedes an input signal to a buffer circuit. In another step, a first level shifting transistor shifts the input signal to a higher voltage using. A second emitter follower transistor impedes the input signal further, followed by a level shifting transistor that namely shifts the signal voltage. Finally, leakage current in the first emitter follower transistor is reduced by providing zero potential across the base and collector of the first emitter follower transistor. This final step of reducing leakage current further increases the impedance on the input signal.

BRIEF DESCRIPTION OF THE DRAWINGS

The accompanying drawings, which are incorporated in and form part of this specification, illustrate embodiments of the invention and, together with the description, serve to explain the principles of the invention.

DETAILED DESCRIPTION OF THE INVENTION

In the following detailed description of the present invention, a high input impedance buffer circuit for reducing effects of leakage current, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 2:
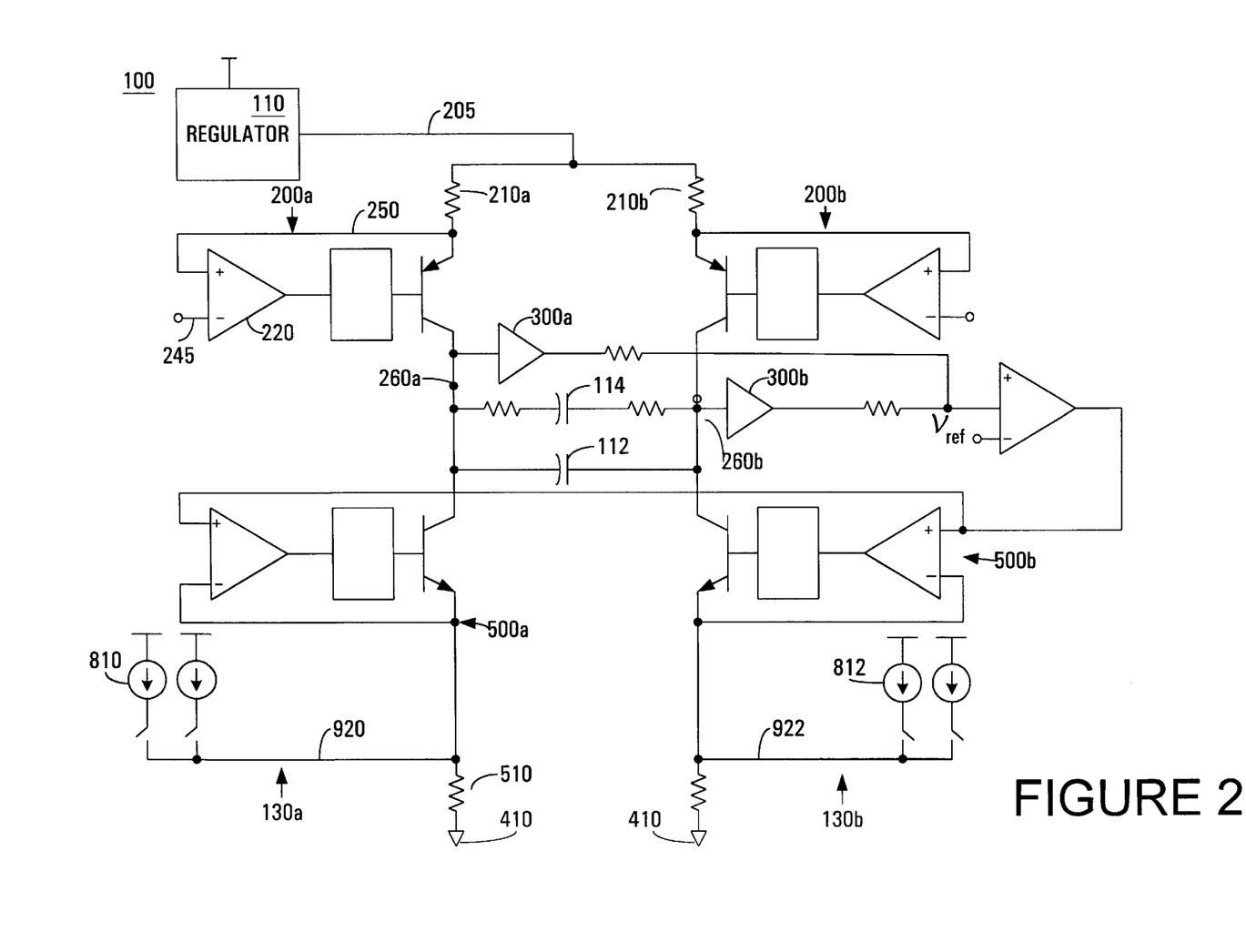
FIG. 2 illustrates phase lock loop implemented clock signal generator circuit incorporating the high input impedance buffer circuits of the present invention.

FIG. 2 illustrates a clock generation circuit 100 as one example in which the high input impedance buffer circuit (300a and 300b) of the claimed present invention can operate. The high input impedance buffer circuit of the present invention can operate in conjunction with a variety of different circuit systems where Ro cancellation is required, e.g., within a digital to analog converter circuit or within an operational amplifier circuit. Therefore, it is appreciated that the clock generation circuit 100 is only one example of such a circuit system.

Figure 3:
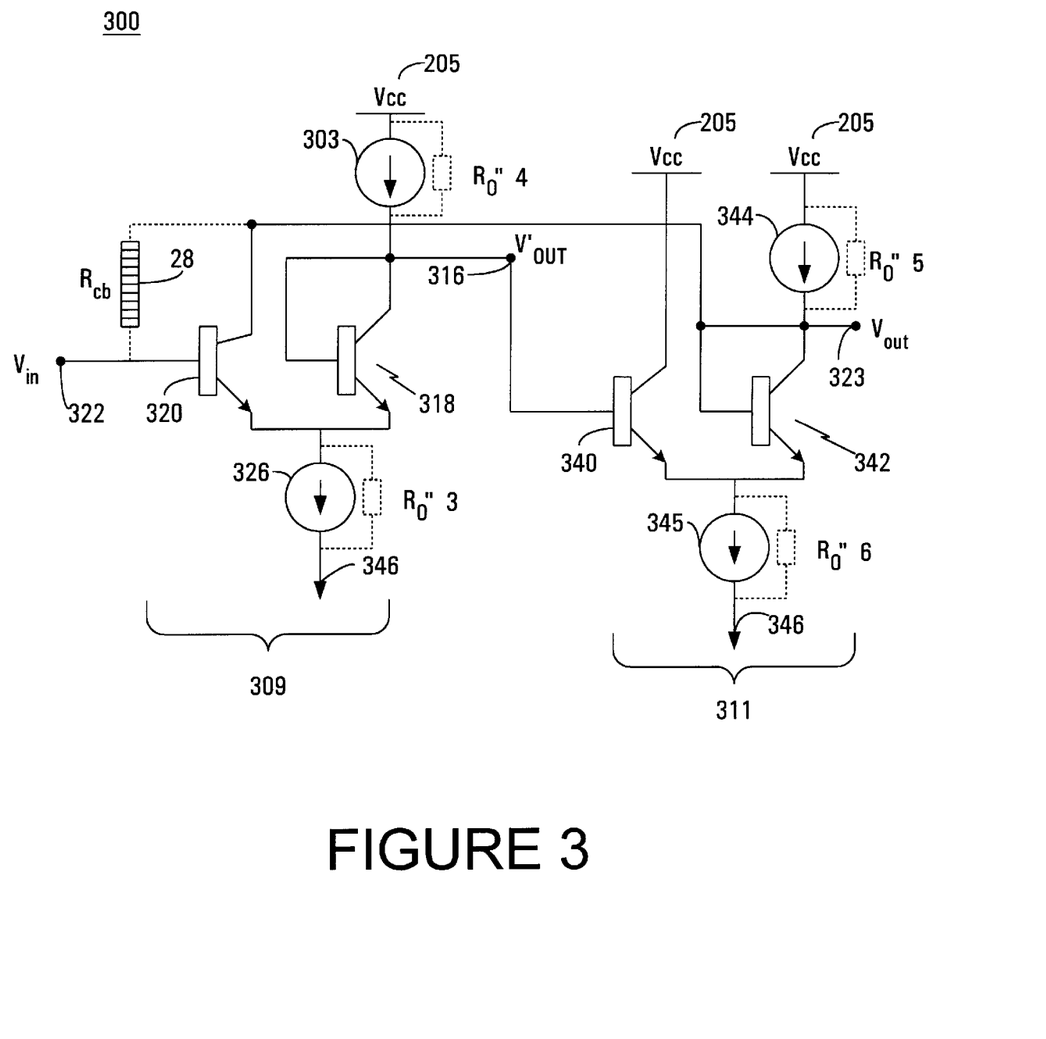
FIG. 3 illustrates a circuit block diagram of one embodiment of the high input impedance buffer circuit in accordance with the present invention.

Specifically, clock generation circuit 100 of FIG. 3 contains a phase lock loop circuit having a differential circuit configuration. Circuit 100 is implemented "on chip," that is, a single integrated circuit chip is used to realize circuit 100. The high side of a power supply voltage is coupled to regulator circuit 110. Although the high side voltage can be of a wide range of voltages, in one embodiment the high side voltage is approximately within the range of 2.7 to 3.3 volts. The regulator 110 is coupled via line 205 to two ends of a differential circuit configuration having differential side 130a and differential side 130b. Each differential side includes a current source circuit (e.g., 200a) and a current sink circuit (e.g., 500a). Voltage supply line 205 is coupled to resistors 210a and 210b. Resistor 210a is coupled to the other components of current source 200a of the present invention.

Current source 200b includes resistor 210b. Current source 200a contains a feedback loop 250 and an operational amplifier circuit 220 which receives a direct current (DC) bias voltage at its (−) input 245 and a feedback loop 250 at its (+) input. A charge pump injects current over line 920.

Each differential side 130a and 130b of FIG. 3 also contains a current sink circuit (e.g., 500a and 500b). The current source circuits 200a and 200b are used, in one embodiment, in combination with current sink circuits 500a and 500b, to maintain current through integrated circuit filter elements 112 and 114. Charge pumps 810 and 812 inject additional current to thereby establish a differential voltage across the filter elements 112 and 114. Filter components 112 and 114 are integrated circuit capacitors and as such they are integrated within the IC chip of circuit 100.

It is appreciated that the high impedance buffer circuits 300a and 300b of the present invention are used, in one embodiment, to sample the voltage across the integrated circuit filter elements 112 and 114. In order to reduce the effects of leakage current, the buffer circuits 300a and 300b have high input impedance as described in more detail below. The differential voltage is used as an input to a voltage controlled oscillator circuit of the phase lock loop circuit within clock generation circuit 100. It is desired to provide a stable voltage at the input of the voltage controlled oscillator circuit in order to reduce clock jitter within the output signal generated by clock generation circuit 100. One way that the voltage can change across the filter elements 112 and 114 is as a result of current fluctuations due to leakage current at the inputs of the buffer 300a and 300b. For this reason, buffers 300a and 300b have high impedance inputs to reduce leakage current.

Specifically, leakage current across the filter elements 112 and 114 charges the filter elements 112 and 114 thereby changing their differential voltage. In circuit 100, the filter elements, e.g., capacitors 112 and 114, are designed to be small internal "on-chip" devices (having correspondingly small capacitance values). As a result, the voltage level across these small filter elements 112 and 114 is very sensitive to small changes in the injected currents at nodes 260a and 260b. The changing differential voltage across filter elements 112 and 114 causes time jitter in circuit 100 because it causes changes in the input voltage of the voltage controlled oscillator.

Therefore, in accordance with the design of the present invention, the current through each differential side 130a and 130b is very stable once it is set to a desired level and held there over time. In accordance with the present invention, by reducing leakage current, the filter elements 112 and 114 maintain a stable differential voltage level. In operation, the current supplied from current sources 200a and 200b (and sank by current sinks 500a and 500b) is adjusted to set a particular operational frequency of clock generation circuit 100 and then held over a hold period. Hold periods are situated in between phase lock loop correction pulses. The present invention advantageously reduces the effects of leakage current at the inputs of buffers 300a and 300b as one way to stabilize the current through the filter elements 112 and 114 during the hold periods. The effects of leakage current are reduced, in accordance with the present invention, by establishing a high input impedance for buffer circuits 300a and 300b. Leakage current is reduced thereby providing a stable input voltage to the voltage controlled oscillator of the phase lock loop circuit. The stable input voltage thereby reduces jitter in the output clock signal of circuit 100.

FIG. 3 illustrates a circuit design 300 that can be used to implement high input impedance buffer 300a and high input impedance buffer 300b of FIG. 2. The high input impedance buffer circuit is comprised of a first stage 309 coupled to a second stage 311. In the first stage, the input (Vin) at node 322 is buffered to the intermediate output node 316 V'out. The intermediate output is likewise buffered to the final output node 323. Typically, in accordance with FIG. 2, Vin is coupled to one side of the integrated circuit filter elements 112 and 114. Final Vout 323 is coupled to the input of the voltage controlled oscillator circuit.

The input impedance of circuit 300 of FIG. 3 is based on the impedance of the first stage 309 times the impedance of the second stage 311. The impedance of the first stage 309 is established by the beta of transistor 320 multiplied by the parallel combination of the parallel output impedances represented by Ro"4 and Ro"3. Likewise, the impedance of the second stage 311 is established by the beta of transistor 340 multiplied by the parallel combination of the parallel output impedances represented by Ro"5 and Ro"6. Therefore, in accordance with the present invention, by increasing the impedances of transistor 320, the input impedance of circuit 300 is thereby increased.

The first stage 309 of circuit 300 begins with a voltage supply level 205 coupled to a base of an emitter follower NPN transistor 320. The emitter of the emitter follower transistor 320 is coupled to a current sink 326 and to the emitter of level shifter transistor 318. The current sink 326 is coupled to ground 346. The base and the collector of the level shifter transistor 318 are coupled to both the intermediate output voltage V'out node 316 and to current source 303. In turn, current source 303 is coupled to voltage source 205.

Second stage 311 of FIG. 3 high input impedance buffer circuit 300 is coupled to intermediate output node V'out 316 . Specifically, intermediate voltage V'out node 316 is coupled to the base of emitter follower transistor 340. In emitter follower transistor 340, the collector is coupled to power source 205, while the emitter is coupled to current sink 345 and to the emitter of level shifter transistor 342. In turn, current sink 345 is coupled to ground 346. In the level shifter transistor 342, the base and collector are both coupled to the final output node Vout 323, to the current source 344, and to the collector of emitter follower transistor 320 located in first stage 309. Current source 344 is coupled to voltage source 205.

As described above, the input impedance of circuit 300 of FIG. 3 is based on the impedance of the first stage 309 times the impedance of the second stage 311. The impedance of the first stage 309 is established by the beta of transistor 320 multiplied by the parallel combination of the parallel output impedances represented by Ro"4 and Ro"3. Likewise, the impedance of the second stage 311 is established by the beta of transistor 340 multiplied by the parallel combination of the parallel output impedances represented by Ro"5 and Ro"6. Therefore, in accordance with the present invention, by increasing the impedances of transistor 320, the input impedance of circuit 300 is thereby increased. FIG. 5A and FIG. 5B illustrate the manner in which these output impedances can be determined.

In operation, circuit 300 produces a higher input impedance by reducing the leakage associated with emitter follower transistor 320 in first stage 309. The resistor Rcb figuratively represents the leakage that occurs between the base and the collector of emitter follower transistor 320 due to the bias voltage existing from the base to the collector. In the claimed present invention, the leakage is reduced by essentially eliminating the bias voltage from the base to the collector.

This can be shown as two conditions. First the input voltage at node 322 at the base of emitter follower transistor 320 in first stage 309 will be shown to be equivalent to the final output voltage at the base and collector of level shifter transistor 342 in second stage 346. The second condition is that the collector of level shifter transistor 342 is at the same voltage as the collector of the emitter follower transistor 320 in first stage 309. The second condition needs no illustration because, as shown in FIG. 3, the components are coupled by line 348. The first condition, on the other hand, is illustrated as follows. The emitter follower transistor 320 has an approximate 0.7 volt drop from the voltage at its base to the voltage at its emitter thanks to the standard voltage drop from a pn junction of the base-emitter interface. Level shifter transistor 318 has the same standard voltage drop across its base-emitter pn junction. Thus the voltage at the base of transistor 318 must be equivalent to the voltage at the base of transistor 320 if the emitters are coupled together at the same voltage.

The same principles apply to the similarly configured second stage 311. Consequently, it is apparent that the final output voltage, Vout 323 is essentially equivalent to the input voltage 322. Likewise, having the collectors of transistors 342 and 320 coupled to the final output voltage Vout 323 yields the desired result of zero bias across the base and collector of emitter follower 320. With essentially zero bias across it, no potential exists for current to flow between the collector and the base. Subsequently, a potential leakage path and impedance degradation has been eliminated by the present claimed invention.

Figure 4A:
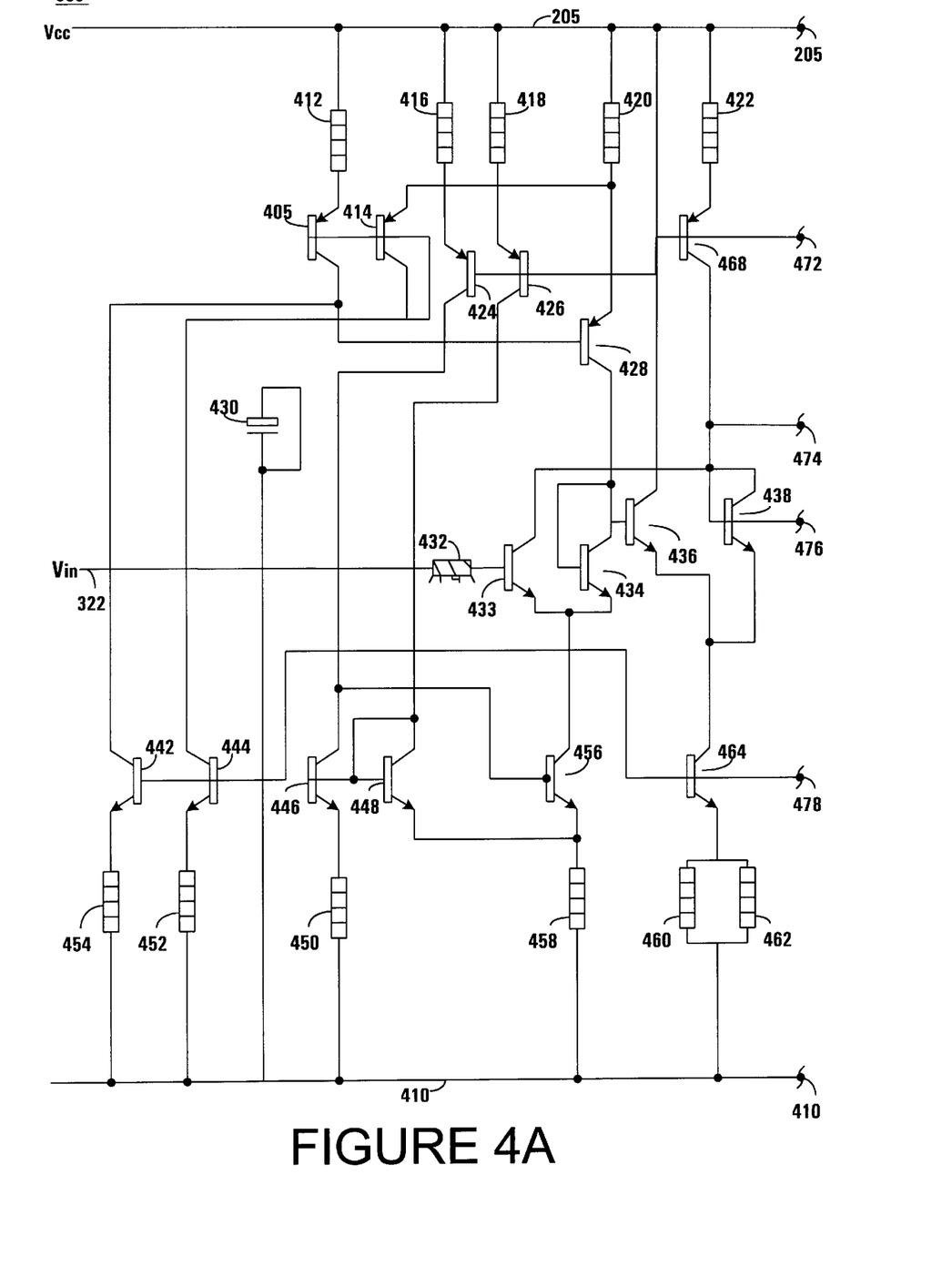
FIG. 4A and FIG. 4B together illustrate a circuit schematic of an embodiment of the high input impedance buffer circuit in accordance with the present invention.
Figure 4B:
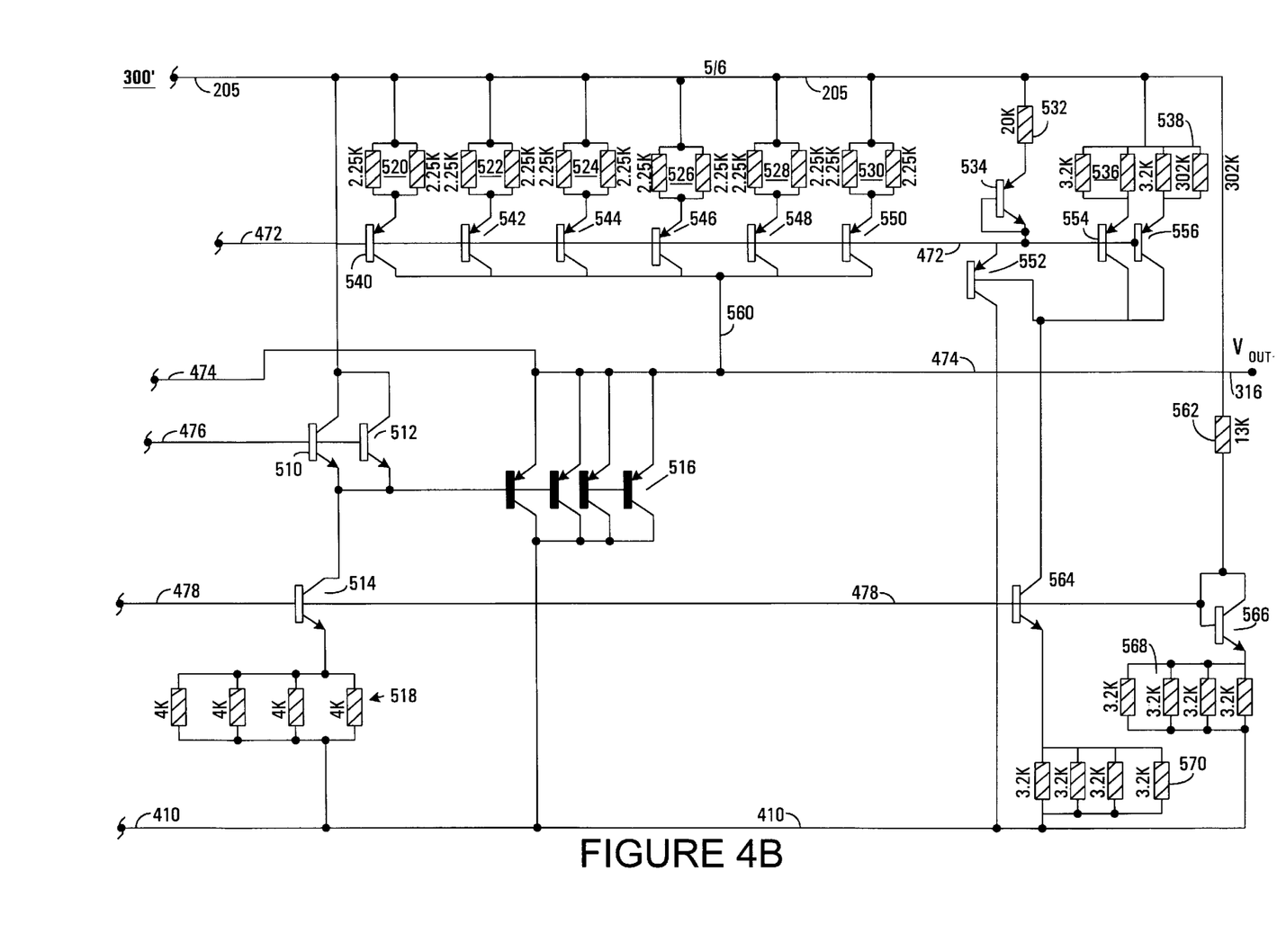

FIG. 4A and FIG. 4B illustrate a particular embodiment 300' of the high input impedance buffer circuit of the present invention. The input, Vin, 322 is shown in FIG. 4A and the final output, Vout, 323 is shown in FIG. 4B.

With reference to FIG. 4A, the supply voltage, Vcc, 205 is coupled to resistors 412, 416, 418, 420 and 422. Resistor 412 is coupled to the emitter of PNP transistor 405 and the collector of transistor 405 is coupled to the base of PNP transistor 428. Resistor 420 is coupled to the emitter of PNP transistor 414 and the collector of transistor 414 is coupled to the collector of NPN transistor 444 and also coupled to the bases of transistors 405 and 414. The collector of transistor 405 is coupled to the base of transistor 428 and also coupled to the collector of NPN transistor 442. Resistors 416 and 418 are respectively coupled to the emitters of PNP transistors 424 and 426. The bases of transistors 424, 426 and PNP transistor 468 are all coupled to node 472. Resistors 420 and 422 are respectively coupled to the emitters of transistors 428 and 468.

The collectors of transistors 424 and 426 are respectively coupled to the collector of NPN transistor 446 and the collector of NPN transistor 448. The collectors of transistors 428 and 468 are respectively coupled to the collector of NPN transistor 434 and the base of NPN transistor 438.

The input signal, Vin, at node 322 of FIG. 4A is coupled to resistor 432 which is coupled to the base of NPN transistor 433. The emitters of transistors 433 and 434 are coupled together and coupled to the collector of NPN transistor 456. The collector of transistor 433 is coupled to the collector and the base of transistor 438 and is coupled to node 474. The base and collector of transistor 434 are coupled together and coupled to the base of transistor 436. The collector of transistor 436 is coupled to Vcc, 205. The base of transistor 438 is coupled to node 476. The emitters of transistors 436 and 438 are coupled together and coupled to the collector of NPN transistor 464.

The bases of transistors 442, 444 and 464 are coupled to node 478. Ground 410 is coupled to resistors 454, 452, capacitor 430, resistors 450, 458 and parallel coupled resistors 460 and 462. The emitters of transistors 442, 444, 446 and 448 are respectively coupled to resistors 454, 452, 450 and 458. The emitter of transistor 464 is coupled to parallel resistors 460 and 462. The collector of transistor 446 is coupled to the base of transistor 456. The base of transistor 448 is coupled to its collector.

With reference to FIG. 4B, resistor pairs 520–530 and resistor 532 and resistor pairs 536 and 538 are coupled to Vcc node 205. The emitters of PNP transistors 540, 542, 544, 546, 548 and 550 are coupled, respectively, to resistor pairs 520, 522, 524, 526, 528 and 530. The bases of PNP transistors 540, 542, 544, 546, 548 and 550 are coupled to node 472. The collectors of transistors 540, 542, 544, 546, 548 and 550 are coupled to node 560. Node 472 is also coupled to the bases of PNP transistors 554 and 556 and to the emitter of PNP transistor 552 and to the collector and base of PNP transistor 534. The base of transistor 552 is coupled to the collectors of transistors 554 and 556.

Node 474 of FIG. 4B is coupled to the emitters of parallel coupled PNP transistors 516 and also coupled to node 560 and supplied as output node 316 (Vout). Vcc 205 is coupled to the collectors of NPN transistors 512 and 510 which have their emitters coupled together and also coupled to the bases of PNP transistors 516. The bases of transistors 510 and 512 are coupled to line 476. The emitters of transistors 510 and 512 are coupled to the collector of NPN transistor 514 which has its base coupled to node 478 and its emitter coupled to resistor network 518. The resistor network 518 is also coupled to ground 410 which is coupled to the collectors of transistors 516.

Ground 410 of FIG. 4B is also coupled to the collector of transistor 552 and to resistor network 570 and to resistor network 568. Node 478 is coupled to the base of NPN transistor 564 and to the base of NPN transistor 566. The collector of transistor 564 is coupled to the collectors of transistors 556 and 554. The base and collector of transistor 566 is coupled to resistor 562 which is coupled to Vcc 205. Resistor networks 570 and 568 are coupled, respectively, to the emitters of transistor 564 and 566. Resistor pairs 536 and 538 are coupled, respectively, to the emitters of transistors 554 and 556.

The operation of the embodiment 300' of FIG. 4A and FIG. 6B is now described. The buffer circuit 300' includes a series of emitter followers and level shifters. Each successive circuit stage operates at higher current and is capable of providing more drive. The first stage consists of emitter follower NPN transistor 433 and level shifter NPN transistor 434. NPN transistor 456 provides biasing current for NPN transistor 433 and NPN transistor 434. PNP transistor 428 produces a current which is half of the current produced by NPN transistor 456. This insures that NPN transistor 433 and NPN transistor 434 operate at the same current and therefore have the same Vbe. This produces an accurate level shift. It is appreciated that resistor 458 is the emitter degeneration resistor for NPN transistor 433. Resistor 420 is the emitter degeneration resistor for PNP transistor 428.

The operational amplifier used to improve the output impedance in NPN transistor 433 is formed by NPN transistor 446, resistor 450, NPN transistor 448 and NPN transistor 456. Current is provided by PNP transistor 424 and PNP transistor 426. The operational amplifier circuit operates as described to follow. Assuming the collector current of NPN transistor 446 is less than the source current of PNP transistor 424. This forces the base voltage of NPN transistor 456 to increase. This in turn increases the voltage of the emitter of NPN transistor 448. This increases the base voltage of NPN transistor 446 since NPN transistor 448 just provides level shifting. When the base of NPN transistor 446 increases, then the collector current of NPN transistor 446 increases. This process continues until NPN transistor 446 sinks all the current sourced by PNP transistor 424. The improvement in output impedance is determined by the gain, A, of this operational amplifier. The gain, A, of the operational amplifier is set by the output impedance of PNP transistor 424 divided by the series combination of resistor 450 and the emitter resistance of NPN transistor 446. The input impedance seen at Vin, node 322, is thereby increased.

A PNP version of this circuit is used to source current to NPN transistor 434. The operational amplifier is formed by PNP transistor 405, PNP transistor 414 and PNP transistor 428. Resistor 420 is the emitter degeneration resistor. Current is provided to PNP transistor 405 and PNP transistor 414 by current sources NPN transistor 442 and NPN transistor 444. The feedback loop forces PNP transistor 405 to operate at a current set by NPN transistor 442.

It should be noted that a number of different resistor configurations can be used in accordance with the present invention for circuit 300.

Figure 5:
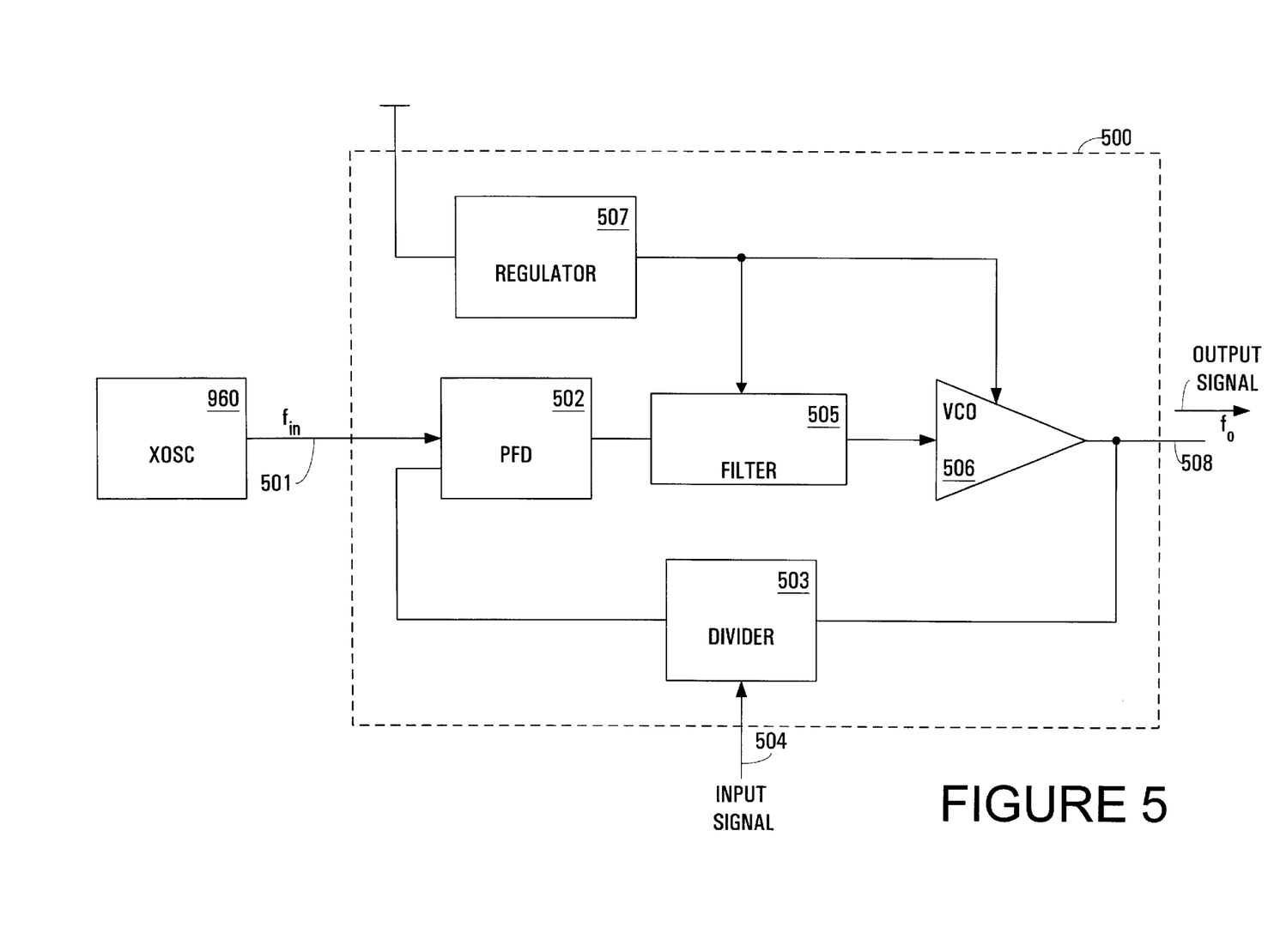
FIG. 5 shows a block diagram of a clock generator using the present invention.

FIG. 5 is a logical block diagram of a clock generator circuit 500 in which embodiments of the present invention can be implemented. Clock generator circuit 500 includes an oscillator 501 that generates an input frequency (fin) at 501. A phase frequency detector (PFD) circuit 502 is coupled to receive frequency 501 and is coupled to a divider circuit 503 which receives an external divider control signal 504. The PFD circuit 502 is coupled to a filter circuit 505 which is also coupled to a voltage controlled oscillator (VCO) circuit 506 which is coupled in feedback to the divider circuit 503. The filter 505 and the VCO circuit 506 are coupled to receive power from a regulator 507 which is coupled to a power supply. The output of the VCO circuit 506 generates the output clock frequency (fo) at 508.

The preferred embodiments of the present invention, a high input impedance buffer circuit having Rcb cancellation for reduced leakage current and improved input impedance, are thus described. While the present invention has been described in particular embodiments, it should be appreciated that the present invention should not be construed as limited by such embodiments, but rather construed according to the below claims.

What is claimed is:

1. A buffer circuit having a high input impedance, said buffer circuit comprising:
   an input lead;
   a first stage having a first emitter follower transistor and a first level shifter transistor, said first emitter follower transistor coupled to said input lead and coupled to said first level shifter transistor, said first stage acting as a voltage follower;
   a second stage having a second emitter follower transistor and a second level shifter transistor, said second emitter follower transistor coupled to said second level shifter transistor, said second level shifter transistor coupled to said first emitter follower transistor, said second stage acting as a voltage follower; and
   an output lead coupled to said second stage.

2. A buffer circuit as described in claim 1 further comprising:
   a power source coupled to said first stage and to said second stage;
   a ground coupled to said first stage and to said second stage.

3. A buffer circuit as described in claim 1 wherein said first stage further comprises:
   a current source having a first transistor and a first emitter degeneration resistor, said first transistor coupled to said first level shifter transistor and to said first emitter degeneration resistor, said first emitter degeneration resistor coupled to said power source; and
   a current sink having a second transistor and a second emitter degeneration resistor, said second transistor coupled to said first emitter follower transistor to said first level shifter transistor and to said second emitter degeneration resistor, said emitter degeneration resistor coupled to said ground.

4. A buffer circuit as described in claim 1 wherein said second stage further comprises:
   a current source having a first transistor and a first emitter degeneration resistor, said first transistor coupled to said first level shifter transistor and to said first emitter degeneration resistor, said first emitter degeneration resistor coupled to said power source; and
   a current sink having a second transistor, a second emitter degeneration resistor and a third emitter degeneration resistor, said second transistor coupled to said second emitter follower transistor, to said second level shifter transistor and to said second emitter degeneration resistor and to said third emitter degeneration resistor, said second emitter degeneration resistor and said third emitter degeneration resistor coupled in parallel, said second emitter degeneration resistor and said third emitter degeneration resistor coupled to said ground.

5. A buffer circuit as described in claim 1 wherein said first emitter follower transistor, said second emitter follower transistor, said first level shifter transistor and said second level shifter transistor are all PNP transistors.

6. A buffer circuit as described in claim 3 wherein said first transistor is a PNP transistor and said second transistor is an NPN transistor.

7. A buffer circuit as described in claim 4 wherein said first transistor is a PNP transistor and said second transistor is an NPN transistor.

8. A buffer circuit as described in claim 1 further comprising an integrated circuit filter element coupled to said high impedance gate of said input transistor and wherein said high impedance gate of said input transistor is for electrically sampling an electrical signal of said integrated circuit filter element with reduced leakage current.

9. A buffer circuit having a high input impedance, said buffer circuit comprising:
   an input lead;
   a first stage having a first emitter follower transistor means and a first level shifter transistor means, said first emitter follower transistor means coupled to said input lead and to said first level shifter transistor means, said first stage acting as a voltage follower;
   a second stage having a second emitter follower transistor means and a second level shifter transistor means, said second emitter follower transistor means coupled to said second level shifter transistor means, said second level shifter transistor means coupled to said first emitter follower transistor means, said second stage acting as a voltage follower; and
   an output lead coupled to said second stage.

10. A buffer circuit as described in claim 9 further comprising:
    a power source coupled to said first stage and to said second stage;
    a ground coupled to said first stage and to said second stage.

11. A buffer circuit as described in claim 9 wherein said first stage further comprises:
    a current source having a first transistor means and a first emitter degeneration resistor, said first transistor means coupled to said first level shifter transistor means and to said first emitter degeneration resistor, said first emitter degeneration resistor coupled to said power source; and
    a current sink having a second transistor means and a second emitter degeneration resistor, said second transistor means coupled to said first emitter follower transistor means to said first level shifter transistor means and to said second emitter degeneration resistor, said emitter degeneration resistor coupled to said ground.

12. A buffer circuit as described in claim 9 wherein said second stage further comprises:
    a current source having a first transistor means and a first emitter degeneration resistor, said first transistor means coupled to said first level shifter transistor means and to said first emitter degeneration resistor, said first emitter degeneration resistor coupled to said power source; and
    a current sink having a second transistor means, a second emitter degeneration resistor and a third emitter degeneration resistor, said second transistor means coupled to said second emitter follower transistor means, to said second level shifter transistor means and to said second emitter degeneration resistor and to said third emitter degeneration resistor, said second emitter degeneration resistor and said third emitter degeneration resistor coupled in parallel, said second emitter degeneration resistor and said third emitter degeneration resistor coupled to said ground.

13. A buffer circuit as described in claim 9 wherein said first emitter follower transistor means, said second emitter follower transistor means, said first level shifter transistor means and said second level shifter transistor means are all PNP transistors means.

14. A buffer circuit as described in claim 11 wherein said first transistor means is a PNP transistor means and said second transistor means is an NPN transistor means.

15. A buffer circuit as described in claim 12 wherein said first transistor means is a PNP transistor means and said second transistor means is an NPN transistor means.

16. A buffer circuit as described in claim 9 further comprising an integrated circuit filter element coupled to said high impedance gate of said input transistor means and wherein said high impedance gate of said input transistor means is for electrically sampling an electrical signal of said integrated circuit filter element with reduced leakage current.

17. In a clock generator circuit having a phase lock loop circuit with integrated circuit filter elements, a high input impedance buffer circuit for sampling voltages at said filter elements, said buffer circuit comprising:

an input lead;

a first stage having a first emitter follower transistor and a first level shifter transistor, said first emitter follower transistor coupled to said input lead and to said first level shifter transistor, said first stage acting as a voltage follower;

a second stage having a second emitter follower transistor and a second level shifter transistor, said second emitter follower transistor coupled to said second level shifter transistor, said second level shifter transistor coupled to said first emitter follower transistor, said second stage acting as a voltage follower; and an output lead coupled to said second stage.

18. A high impedance buffer circuit as described in claim 17 further comprising:

a power source coupled to said first stage and to said second stage;

a ground coupled to said first stage and to said second stage.

19. A buffer circuit as described in claim 17 wherein said first stage further comprises:

a current source having a first transistor and a first emitter degeneration resistor, said first transistor coupled to said first level shifter transistor and to said first emitter degeneration resistor, said first emitter degeneration resistor coupled to said power source; and a current sink having a second transistor and a second emitter degeneration resistor, said second transistor coupled to said first emitter follower transistor to said first level shifter transistor and to said second emitter degeneration resistor, said emitter degeneration resistor coupled to said ground.

20. A buffer circuit as described in claim 17 wherein said second stage further comprises:

a current source having a first transistor and a first emitter degeneration resistor, said first transistor coupled to said first level shifter transistor and to said first emitter degeneration resistor, said first emitter degeneration resistor coupled to said power source; and a current sink having a second transistor, a second emitter degeneration resistor and a third emitter degeneration resistor, said second transistor coupled to said second emitter follower transistor, to said second level shifter transistor and to said second emitter degeneration resistor and to said third emitter degeneration resistor, said second emitter degeneration resistor and said third emitter degeneration resistor coupled in parallel, said second emitter degeneration resistor and said third emitter degeneration resistor coupled to said ground.

21. A buffer circuit as described in claim 17 wherein said first emitter follower transistor, said second emitter follower transistor, said first level shifter transistor and said second level shifter transistor are all PNP transistors.

22. A buffer circuit as described in claim 19 wherein said first transistor is a PNP transistor and said second transistor is an NPN transistor.

23. A buffer circuit as described in claim 20 wherein said first transistor is a PNP transistor and said second transistor is an NPN transistor.

24. A buffer circuit as described in claim 17 further comprising an integrated circuit filter element coupled to said high impedance gate of said input transistor and wherein said high impedance gate of said input transistor is for electrically sampling an electrical signal of said integrated circuit filter element with reduced leakage current.

25. In a buffer circuit having an emitter follower coupled to a level shifter transistor in a first stage and an emitter follower coupled to a level shifter transistor in a second stage, said first stage coupled to said second stage, a method for increasing an input impedance to said buffer circuit, said method comprising the steps of:

impeding an input signal to a buffer circuit using a first emitter follower transistor;

shifting said input signal to a higher voltage using a first level shifting transistor;

impeding said input signal using a second emitter follower transistor;

shifting said input signal to a higher voltage by using a level shifting transistor in said second stage;

reducing leakage current in said first emitter follower by providing zero potential across a base and a collector of said first follower transistor and across a base and a collector of said second emitter follower transistor, said step of reducing leakage current further increasing impedance of said buffer circuit.

26. The method as described in claim 25 wherein said step of reducing leakage current of said first emitter follower comprises the step of:

coupling said collector of said first emitter follower transistor to said base and to said collector of said second level shifter.

27. The method as described in claim 25, further comprising the steps of:

providing a bias current to said first emitter follower and said first level shifter; and providing a supply current to said first level shifter, said supply current being half of said bias current.

28. The method as described in claim 25, further comprising the steps of:

providing a bias current to said second emitter follower and said second level shifter; and providing a supply current to said second level shifter, said supply current being half of said bias current.

* * * * *